United States Patent [19]
Hsia et al.

[11] Patent Number: 6,162,724
[45] Date of Patent: Dec. 19, 2000

[54] METHOD FOR FORMING METALIZATION FOR INTER-LAYER CONNECTIONS

[75] Inventors: Liang-Choo Hsia, Taipei; Thomas Chang, Hsin-Chu, both of Taiwan

[73] Assignee: Mosel Vitelic Inc., Hsin Chu, Taiwan

[21] Appl. No.: 09/059,517

[22] Filed: Apr. 13, 1998

Related U.S. Application Data

[63] Continuation-in-part of application No. 08/712,733, Sep. 12, 1996, abandoned.

[51] Int. Cl.⁷ .................. H01L 21/4763; H01L 21/44; H01L 21/461
[52] U.S. Cl. .................. 438/669; 438/636; 438/671; 438/738
[58] Field of Search .................. 438/623, 636, 438/669, 744, 738, 952, 671; 257/771

[56] References Cited

U.S. PATENT DOCUMENTS

| | | | |
|---|---|---|---|
| 5,350,488 | 9/1994 | Webb | 156/643 |
| 5,369,053 | 11/1994 | Fang | 437/194 |
| 5,484,741 | 1/1996 | Bergemont | 437/43 |
| 5,522,520 | 6/1996 | Kawamoto | 216/62 |
| 5,604,381 | 2/1997 | Shen | 257/773 |
| 5,700,720 | 12/1997 | Hashimoto | 437/195 |
| 5,739,045 | 4/1998 | Cronin et al. | 437/60 |
| 5,849,637 | 12/1998 | Wang | 438/699 |
| 5,932,492 | 8/1999 | Hahm et al. | 438/737 |
| 6,017,815 | 1/2000 | Wu | 438/634 |

*Primary Examiner*—John F. Niebling
*Assistant Examiner*—Ha Tran Nguyen
*Attorney, Agent, or Firm*—Tung & Associates

[57] ABSTRACT

The present invention provides an improved method for forming metalization layers for inter-layer connections including the steps of first providing a substrate, then depositing a metal layer on the substrate, then depositing a dielectric layer overlying the metal layer, etching away an opening in the dielectric layer to expose at least partially the metal layer, and etching an opening in the metal layer by using the dielectric layer as a mask to at least partially expose the underlying substrate. The method may optionally includes the step of blanket depositing a thin oxide layer and then an inter-level dielectric layer on top of the device.

12 Claims, 1 Drawing Sheet

METHOD FOR FORMING METALIZATION FOR INTER-LAYER CONNECTIONS

This application is a continuation-in-part of application Ser. No. 08/712,733 filed on Sep. 12, 1996, now abandoned.

FIELD OF THE INVENTION

The present invention generally relates to a method for forming metalization layers in semiconductor devices and the device made and more particularly, relates to a method for forming metalization layers for inter-layer connections in semiconductor devices including the step of first depositing a dielectric layer on top of a metalization layer prior to the reactive ion etching of said metal layer and devices made by such method.

BACKGROUND OF THE INVENTION

In the semiconductor fabrication technology, various devices built on a chip must be connected in a specific configuration in order to form a desired circuit. The formed circuit must also be accessible to an outside circuit through conducting pads for testing by metal probes and for bonding to conductive bumps in order to complete a packaged chip. Even though widely used doped silicon and polysilicon conduct electricity, they are of very limited use as interconnections because of their prohibitively high electrical resistance and their lack of interconnecting flexibility.

In a semiconductor device, usually at least one low resistance conducting film must be deposited and patterned to form contacts and interconnects throughout different regions in the chip. Many single metal systems such as aluminum, tungsten, copper, etc. and their alloys are available for this purpose. Among these metals, aluminum is a popularly used interconnect material due to its high conductivity, its compatibility with silicon-based technology, and its low processing costs.

In a simplified form, a metalization process can be carried out by first covering a wafer with an insulating layer, contacting and etching openings in the insulating layer, and then depositing and defining an aluminum film to form both contacts and interconnects. In modern semiconductor devices where dimensions are continuously shrinking and devices are more densely packed together, the layout and the utilization of a metalization system can become dominant factors in determining the circuit density and speed. Major factors that determine a metalization system are the contacting scheme, the inter-level dielectrics, the interconnecting metals, and the reliability of the metalization system.

The metal materials used in building interconnects must satisfy certain basic requirements in order to meet the criteria of circuit performance, fabrication yield and product reliability. The metal should have low series and contact resistance, electromigration into the silicon, satisfactory adhesion to insulators and contacted surfaces, good uniformity and resistance to corrosion. Two of the more commonly used metal materials for interconnects and contacts are aluminum alloys and tungsten. Aluminum can meet most of the performance requirements of an interconnect but suffers a deficiency known as electromigration which can be minimized by adding a small amount of copper into aluminum to form an alloy. Tungsten, even though is less susceptible to electromigration and has great conformity during deposition has a significantly higher electrical resistivity than aluminum. It is therefore only used in lower-level metals. Copper has also been used in interconnects because of its superior conductivity and higher electromigration resistance than aluminum. However, copper is difficult to delineate and therefore is normally cladded with a barrier metal to inhibit its diffusion into oxide and silicon.

The metal interconnects can be formed by various deposit on methods such as an evaporation technique, a sputtering technique or a chemical vapor deposition technique. An improved technique of collimated sputtering can also be used. The sputtering technique is widely used in depositing aluminum and its alloys due to its high deposition rate, uniform step coverage and contact hole filling capabilities. The collimated sputtering technique ensures that sufficient metal particles cover the bottom of a high aspect-ratio contact before the material blocks the top of the opening.

After a metal material such as an aluminum alloy of Al—Cu—Si or Al—Cu is deposited onto a film in a semiconductor device, a layer of photoresist masking is deposited on the surface of the metal layer to perform subsequent lithographic and reactive ion etching (RIE) processes to create openings. This is widely used in the DRAM metalization patterning process for building interconnects. The degree of success of such a process depends on the capability of generating a reproducible and consistent sidewall on the metal during the RIE process when the sidewall acts as a barrier to isotropic undercut by the RIE chemicals.

Referring initially to FIG. 1, wherein a conventional metalization process on a silicon wafer is shown. A semiconductor device 10 having a silicon substrate 12, a metal layer 14, and a photoresist layer 16 deposited on top is shown. After an opening 22 is etched into the metal layer 14 by using the pattern in the photoresist layer 16, chemical compound 24 of a corrosive nature is frequently formed to cover the metal surface 26 in the opening 22. The chemical compound 24 is formed by a reaction between the photoresist film which is frequently a hydrocarbon polymer and the chlorine or fluorine molecules contained in the reactive ion etching chemicals. The reactive ion etching technique is a frequently used etching technique in the manufacture of densely packed semiconductor devices. In reactive ion etching, positive plasma ions generated in a parallel-plate RF reactor are used to provide a source of energetic particles bombardment on the surface to be etched and producing a fairly vertical etch in the film with minimal undercutting. The ion bombardment process increases the reaction rate of spontaneously occurring processes and prompts reactions which would otherwise proceed at a much slower rate without radiation. In a reactive ion etching reactor, the wafer is placed on a powered electrode of a parallel-plate RF reactor. The horizontal surface of the wafer is subjected to both the reactant chemical species and their impinging ions, while the vertical sidewalls are only subjected to reactive species. This is one reason that fairly vertical openings can be obtained in an etched film.

The chemical compound 24 of a corrosive nature coated on the inside wall 26 of the metal layer 14 at opening 22 can cause metal corrosion problems. This presents a serious drawback to the process especially when aluminum is used as the metal interconnect material due to its poor corrosion resistance. For instance, in a conventional aluminum metalization process, aluminum metal particles are first sputtered deposited on a substrate 12. A photoresist layer 16 is then deposited on top of the metal layer 14 and patterned by a photolithography process. After windows are opened in the metal layer 14 by a reactive ion etching process, the photoresist layer 16 is stripped off the metal layer 14 by a solvent based cleaning method. The aluminum metal layer 14 is then oxidized to form aluminum oxide in order to stop any further corrosion of the metal. This practice is sometimes called a surface passivation process. After the device is rinsed by deionized water, the metal layer 14 is annealed to improve the metal quality by relieving stress and improving the electrical conductance. The device is then blanket deposited in a chemical vapor deposition process a layer of an inter-layer dielectric material to complete the fabrication. As stated previously, when chemical compound 24 of a corrosive nature covers the metal surface 26 at the opening 22, it would prevent or slow down the aluminum oxidization process due to the corrosion on the aluminum surface 24. Since the success of a RIE process depends very much on its capability to generate a reproducible and consistent sidewall during the etch (which acts as a barrier to isotropic undercut), the chemical compound formed by the interaction of a photoresist mask with the RIE chemistry which corrodes the sidewall and effectively widens the resist image. The end result is a final etched feature that is wider than the resist image by a component of the etch bias. Furthermore, the corrosive compound on the sidewall may become infused with the active etchant during RIE that it must be throughly passivated by a post-RIE processing step prior to venting of the chamber, in order to prevent the initiation of aluminum corrosion reactions.

It is therefore an object of the present invention to provide a method for forming metalization for inter-layer connections in a semiconductor device that does not have the drawbacks and shortcomings of conventional metalization processes.

It is another object of the present invention to provide a method for forming metalization for inter-layer connections in a semiconductor device by first depositing a dielectric layer on top of a metal layer for use as the masking film in the reactive ion etching of the metal layer.

It is a further object of the present invention to provide a method for forming metalization for inter-layer connections in a semiconductor device that does not have a metal corrosion problem caused by chemical compound formed between a photoresist material and the RIE chemicals.

It is yet another object of the present invention to provide a method for forming metalization for inter-layer connections in a semiconductor device by depositing an additional dielectric material layer immediately adjacent to the metal layer.

It is still another object of the present invention to provide a semiconductor structure that includes a substrate, a metal layer, a dielectric layer deposited on the metal layer and an opening through the metal layer and the dielectric layer exposing the substrate.

SUMMARY OF THE INVENTION

In accordance with the present invention, a method for forming metalization for inter-layer connections in a semiconductor device and a semiconductor device made by such method are provided.

In a preferred embodiment, a method for forming the metalization is carried out by first providing a substrate, then depositing a metal layer on the substrate, then depositing a dielectric layer overlying the metal layer, etching an opening in the dielectric layer to expose at least partially the meal layer, and then etching an opening in the metal layer by using the dielectric layer as a mask to expose at least partially the substrate. In the method, the substrate can be of a semiconducting substrate and the metal layer deposited can be aluminum, copper, or any other suitable conductive metals and their alloys. The dielectric layer can be deposited of silicon oxnitride, silicon oxide or silicon nitride by a chemical vapor deposition technique. The openings in the dielectric layer and the metal layer are conducted by a technique of reactive ion etching. Since a photoresist mask based on a polymeric material is not used in opening the metal layer, no corrosion of metal will occur which would otherwise occur due to a corrosive compound formed between the RIE chemicals and the photoresist material.

The present invention is further directed to a semiconductor structure that has a semiconductive substrate, a metal layer overlying the substrate, a dielectric layer overlying the metal layer, and an opening through the metal layer and the dielectric layer to expose at least partially the substrate. The semiconductor structure may further include a thin oxide layer covering the exposed substrate, the metal layer and the dielectric layer. The semiconductor structure may also include an inter-layer dielectric material which substantially fills the opening and covers the dielectric layer.

BRIEF DESCRIPTION OF THE DRAWINGS

These objects, features and advantages will become apparent by the following specification and the appended drawings in which.

DETAILED DESCRIPTION OF THE PREFERRED EMBODIMENT

The present invention provides a method for forming metalization for inter-layer connections by first depositing a dielectric layer on top of a metalization layer and then using the dielectric layer as a masking for the metal layer in a RIE process such that no harmful chemical compound can be formed to corrode the metal layer.

Figure 2:
FIG. 2 is an enlarged, cross-sectional view of a substrate having a metal layer deposited on top according to the present invention method.

Referring initially to FIG. 2, where it is shown a silicon substrate 30 having a metalization layer 32 deposited on top. The metalization layer 32 can be of any one of suitable materials such as aluminum, copper, tungsten, molybdenum, and alloys thereof. The metal layer which is a single metal layer of a homogeneous metallic material, can be deposited by a variety of known techniques such as evaporation, sputtering and chemical vapor deposition, etc. Even though, for aluminum material, the sputtering technique is a more common and higher throughput method for depositing metalization layers. After the deposition of the metalization layer, the present invention method does not deposits a photoresist layer on top which would otherwise cause the formation of corrosive chemical compounds to corrode the metal layer after a window is opened. Instead, a dielectric layer 34 is blanket deposited on top of the metal layer 32. This is shown in FIG. 3.

The silicon wafer utilized and shown in FIG. 2 can be of any conventional construction having a diameter of 200 mm, 300 mm or larger. The present invention method can be most suitably carried out in a cluster type vacuum chamber arrangement in which a wafer shuttle is used in between the chambers at various stations, e.g., 4 or 5 vacuum chambers in a cluster, such that vacuum is not broken between the various processing steps. This method greatly improves the throughput of the fabrication process.

Figure 3:
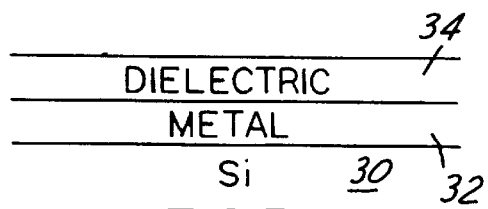
FIG. 3 is an enlarged, cross-sectional view of a present invention substrate deposited with a metal layer and a dielectric layer.
Figure 8:
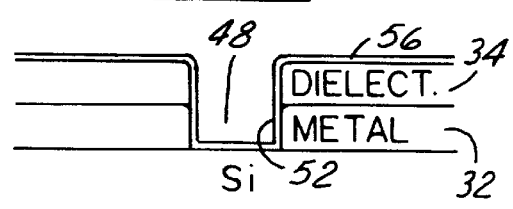
FIG. 8 is an enlarged, cross-sectional view of that shown in FIG. 7 with a thin layer of oxide deposited on top according to the present invention method.

The dielectric layer 34 deposited, shown in FIG. 3, can be one of many suitable materials such as silicon oxinitride, silicon oxide or silicon nitride. A suitable technique for processing such materials is a chemical vapor deposition method. The thickness of the dielectric layer deposited is in the range between about 1000 Å and about 10000 Å. The depositions in the chemical vapor deposition method used are similar to those in a conventional method.

Figure 4:
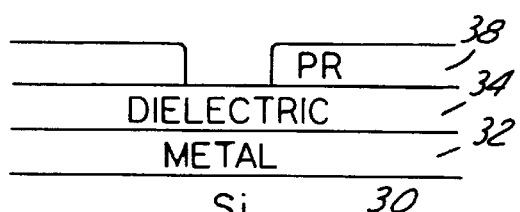
FIG. 4 is an enlarged, cross-sectional view of that shown in FIG. 3 with an additional patterned photoresist layer deposited on top according to the present invention method.
Figure 9:
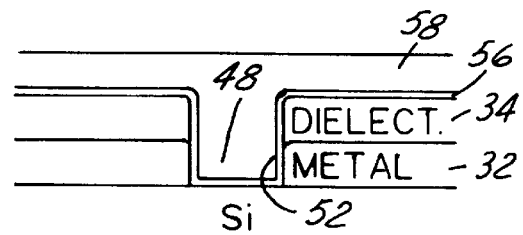
FIG. 9 is an enlarged, cross-sectional view of that shown in FIG. 8 with an inter-layer dielectric material filling the opening and covering the top of the dielectric layer according to the present invention method.
Figure 5:
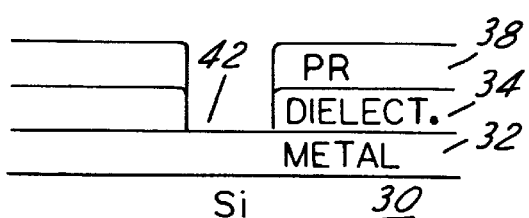
FIG. 5 is an enlarged, cross-sectional view of that shown in FIG. 4 with an opening etched in the dielectric layer by the present invention method.

After a photoresist layer 38 is deposited on top of the dielectric layer 34, the photoresist layer 38 is patterned by a photolithography method. A reactive ion etching technique is then used to etch the opening 42 in the dielectric layer 34. This is shown in FIG. 5. As shown in FIGS. 4 and 5, the photoresist layer 38 does not have a direct contact with the metal layer 32, and therefore, no harmful corrosive chemical compound can be formed between the fluorine and chlorine contained in the RIE chemicals and the polymeric photoresist material. This is one of the advantages made possible by the present invention.

In the next step of the fabrication process, the photoresist film 38 shown in FIG. 5 is stripped away by a solvent based cleaning process. The dielectric layer 34 is then used as a masking for patterning the metal layer 32. Through a second reactive ion etching process, a window or opening 48 is created in the metal layer 32. It should be noted that since no photoresist layer of a polymeric based material is used in masking the metal layer 32, i.e., instead, a dielectric material of either silicon oxynitride, silicon oxide or silicon nitride is used, the metal layer 32 never touches the photoresist layer. The possibility that a harmful corrosive compound is generated to coat the opening 48 on the metal sidewall 52 is completely eliminated.

In the next processing step, a thin layer of oxide material is deposited by a chemical vapor deposition method to coat the opening 48 and to cover the top surface 56 of the dielectric layer 34.

The wafer is then taken out of the vacuum chamber cluster into a separate chamber for carrying out a chemical vapor deposition process for depositing an inter-layer dielectric material 58 to complete the fabrication process for the device.

Figure 1:
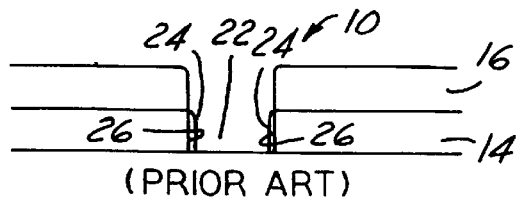
FIG. 1 is an enlarged, cross-sectional view of a metalization layer having a photoresist layer deposited on top by a conventional process.
Figure 6:
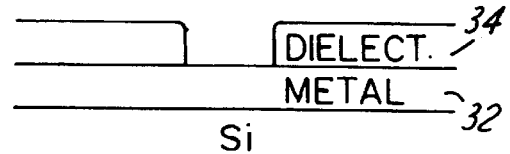
FIG. 6 is an enlarged, cross-sectional view of that shown in FIG. 5 with the photoresist layer removed by the present invention method.
Figure 7:
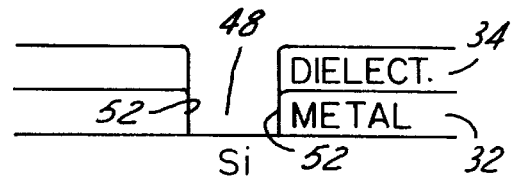
FIG. 7 is an enlarged, cross-sectional view of that shown in FIG. 6 with the dielectric layer deposited on top of the metal layer as a masking film according to the present invention method.

Other benefits are also be made possible by the present invention method which includes, for instance, the annealing step for the metal layer can be eliminated because the dielectric mask (i.e., of silicon oxynitride, silicon oxide or silicon nitride) deposition process occurs at a temperature close to that of the metal annealing temperature. Furthermore, since the thickness of the dielectric layer can be tuned according to the equation $2d=k\lambda/n$, where d is the layer thickness, n is the index of refraction, k is an integer and $\lambda$ is the wave length, the dielectric layer can serve as an effective anti-reflection layer. Therefore, the dielectric layer 34 is not only used as a masking for the metal layer 32 (shown in FIGS. 6 and 7), but is also used as an anti-reflection layer to facilitate the photolithography process.

In carrying out the present invention method, a cluster type vacuum chamber arrangement can be most suitably used for achieving improved throughput of the fabrication process. The cluster vacuum chamber process is capable of conducting an oxynitride (or oxide, silicon nitride) mask opening process in a first vacuum chamber, a photoresist stripping process in a second vacuum chamber, a metal patterning process in a third vacuum chamber and finally the deposition process for a thin layer of inter-level dielectric to hermetically seal the device to prevent it from contacting the atmosphere upon exiting the cluster in the fourth vacuum chamber. Although the cluster arrangement requires the additional tasks of the oxynitride masking step and the etching of the metal film with the oxynitride (or other dielectric material) mask, the cluster arrangement offers significant benefits such as fewer overall unit hours, lower corrosion exposure, elimination of the metal annealing process, elimination of the solvent based cleaning/oxidation and the deionized water rinsing processes, the potential for enhanced linewidth control and an overall lower fabrication cost.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for forming metalization for inter-layer connections comprising the steps of:
   depositing a single metal layer on a silicon substrate such that the single metal layer contacts the silicon substrate;
   depositing a dielectric layer directly on said metal layer;
   etching an opening in said dielectric layer exposing at least partially said single metal layer; and
   etching an opening in said single metal layer by using said dielectric layer as a mask to expose at least partially the underlying substrate wherein said dielectric layer is a silicon nitride layer which further functions as an anti-reflective coating layer for said single metal layer.

2. A method according to claim 1 further comprising the step of providing said substrate as a region in a semiconducting substrate.

3. A method according to claim 1, wherein said single metal layer deposited is selected from the group consisting of Al, Cu, and alloys thereof.

4. A method according to claim 1, wherein said single metal layer is deposited by a physical vapor deposition or a sputtering technique.

5. A method according to claim 1, wherein said dielectric layer is deposited by a chemical vapor deposition technique.

6. A method according to claim 1, wherein said etching steps for openings in said dielectric layer and said single metal layer are conducted by a reactive ion etching (RIE) technique.

7. A method for forming metalization for inter-layer connections according to claim 1, wherein substantially all the processing steps are conducted in a clustered vacuum process chamber without breaking vacuum.

8. A method for forming a metalization layer for interconnections that does not have a metal sidewall corrosion problem comprising the steps of:

providing a semiconductor substrate;

depositing a single metal layer on said substrate;

depositing a first dielectric layer on said metal layer;

photomasking and etching an opening through said first dielectric layer exposing at least partially the underlying metal;

removing said photomasking material on said first dielectric layer;

etching an opening in said single metal layer by using said first dielectric layer as a mask to at least partially exposing the underlying substrate; and depositing a second dielectric layer into said opening and directly on top of said first dielectric layer wherein said dielectric layer is a silicon nitride layer which further functions as an anti-reflective coating layer for said single metal layer.

9. A method according to claim 8, wherein substantially all the processing steps are conducted in clustered vacuum process chambers through a vacuum lock without breaking vacuum during the steps.

10. A method according to claim 8, wherein said etching steps are conducted by a reactive ion etching process.

11. A method according to claim 8, wherein said second dielectric layer is an inter-layer dielectric (ILD).

12. A method according to claim 8, wherein said and second dielectric layers is deposited of materials selected from the group consisting of silicon oxynitride, silicon oxide silicon nitride.

* * * * *